United States Patent [19]
Hamada et al.

[11] Patent Number: 5,707,882
[45] Date of Patent: Jan. 13, 1998

[54] SEMICONDUCTOR DEVICE FOR DISPLAY DEVICE USING THIN FILM TRANSISTORS AND PROCESS OF MANUFACTURING THE SAME

[75] Inventors: Hiroki Hamada, Hirakata; Kiichi Hirano; Nobuhiro Gouda, both of Kobe; Hisashi Abe, Gifu-ken; Eiji Taguchi; Nobuhiko Oda, both of Hashima; Yoshihiro Morimoto, Inazawa, all of Japan

[73] Assignee: Sanyo Electric Co., Ltd., Osaka, Japan

[21] Appl. No.: 376,795

[22] Filed: Jan. 23, 1995

[30] Foreign Application Priority Data

| Jan. 26, 1994 | [JP] | Japan | 6-006891 |
| May 31, 1994 | [JP] | Japan | 6-118850 |
| Nov. 18, 1994 | [JP] | Japan | 6-285191 |
| Dec. 14, 1994 | [JP] | Japan | 6-310825 |

[51] Int. Cl.$^6$ .................... H01L 21/84; H01L 21/265
[52] U.S. Cl. ................. 437/21; 437/41; 437/233
[58] Field of Search ................. 437/21, 40–41, 437/101, 909, 233; 257/72

[56] References Cited

U.S. PATENT DOCUMENTS

| 5,341,012 | 8/1994 | Misawa et al. | 257/351 |
| 5,366,909 | 11/1994 | Song et al. | 437/40 |
| 5,403,755 | 4/1995 | Chae | 437/21 |
| 5,512,494 | 4/1996 | Tanabe | 437/21 |
| 5,523,240 | 6/1996 | Zhang et al. | 437/21 |

FOREIGN PATENT DOCUMENTS

| 62-82401 | 6/1981 | Japan | |
| 4-279064 A | 10/1992 | Japan | 257/72 |
| 6-125984 | 5/1994 | Japan | 437/41 |

*Primary Examiner*—John Niebling
*Assistant Examiner*—Richard A. Booth
*Attorney, Agent, or Firm*—Sheridan Ross P.C.

[57] ABSTRACT

A method of manufacturing a polycrystalline silicon film having a particular field effect mobility is disclosed. A first polycrystalline silicon film is formed on a transparent insulation substrate. The surface of the silicon film is oxidized, and an amorphous silicon film is formed on the first polycrystalline silicon film and oxide layer. The amorphous silicon film is subjected to a solid phase growth process to be converted to a second polycrystalline silicon film. The field effect mobility of the second polycrystalline silicon film can be adjusted to a desired value by controlling the relative thicknesses of the first and second polycrystalline silicon films.

13 Claims, 12 Drawing Sheets

5,707,882

1

SEMICONDUCTOR DEVICE FOR DISPLAY DEVICE USING THIN FILM TRANSISTORS AND PROCESS OF MANUFACTURING THE SAME

BACKGROUND OF THE INVENTION

1. Field of the Invention

The present invention relates in general to a semiconductor device and its manufacturing process, and in particular to a thin film transistor used in the semiconductor device and its manufacturing process, and a display device and its manufacturing process.

2. Description of the Related Art

Active matrix type liquid crystal displays (LCD's) utilizing thin film transistors have recently been recognized as high quality display devices. Dot matrix type LCD's, using dots arranged in the form of a matrix, are classified into two types: active and simple matrix systems.

In simple matrix systems, the liquid crystals of pixels arranged in the matrix are directly driven in synchronism with scanning signals. The pixel portion of liquid crystal panel of an LCD is formed by using electrodes and liquid crystals. Accordingly, when the number of scanning lines is increased, the driving time (i.e., duty cycle) for each pixel is shortened. This results in the reduction of contrast.

In active matrix systems, each of pixels arranged in the matrix has an active element as a pixel driving element and a signal holding element (i.e., pixel capacitance). Both the driving and holding elements are integrated in the pixel. Each pixel performs signal storage operation, so that liquid crystals are semi-statically driven. In other words, each pixel driving element functions as a switching element controlled in response to a scanning signal. When a pixel driving element is turned on, the associated pixel receives a data signal indicative of display data via the pixel driving element. This drives the liquid crystal. Thereafter, when the pixel driving element is turned off, the data signal applied to the pixel is stored as an electric charge in an associated signal holding element. Based on the accumulated charge, the drive control of the liquid crystal is maintained until the pixel driving element is turned on again. Therefore even with reduced driving times for each pixel, due to increased numbers of scanning lines, the drive control of liquid crystal will remain unaffected and no reduction in contrast will occur. Thus, active matrix systems provide displays having a much higher quality than that of simple matrix systems.

Active matrix systems are generally classified by the type of pixel driving elements used: a three terminal type transistor. The transistor type matrix system, although difficult to manufacture compared with the diode type matrix system, lends itself to improved contrast and resolution characteristics. Transistor type matrix systems moreover allow the possibility to achieve CRT quality in a LCD device.

Thin film transistors (TFT's) are generally used as pixel driving elements in transistor type LCD's. An active layer in a TFT is a semiconductor thin film formed on an insulation substrate, and is generally an amorphous silicon or a polycrystalline silicon film. A TFT using an amorphous silicon film as an active layer is referred to as an amorphous silicon TFT, while a TFT using a polycrystalline silicon film as an active layer is referred to as a polycrystalline silicon TFT. Polycrystalline silicon TFT's have an advantage in that they have higher field effect mobility and hence higher drivability compared with amorphous silicon TFT's. Therefore, polycrystalline silicon TFT's can be used not only as pixel

2 driving elements but also as elements forming logic circuits. Thus, the use of polycrystalline silicon TFT's allows the pixel portion of a LCD and the peripheral driving circuits to be integrated on the same substrate. This makes it possible to form polycrystalline silicon TFT's as pixel driving elements and polycrystalline silicon TFT's as peripheral driving circuits during the same manufacturing step.

FIG. 1 is a block diagram showing a configuration of a general active matrix type LCD. A pixel portion 101 has a plurality of scanning lines (i.e., gate lines) $G_1, \ldots, G_n, G_{n+1}, \ldots, G_m$ and a plurality of data lines (i.e., drain lines) $D_1, \ldots, D_n, D_{n+1}, \ldots, D_m$. The gate and drain lines extend perpendicularly to each other, and the pixels 102 are provided at the intersections thereof. The gate lines are connected to a gate driver 103 which supplies the gate lines with gate signals i.e., scanning signals. The drain lines are connected to a drain driver 104 which supplies the drain lines with data signals i.e., video signals. These drivers 103 and 104 form a peripheral driving circuit 105. An LCD, having at least one of the drivers 103 or 104 formed on the substrate on which the pixel portion 101 resides, is generally referred to as an integral driver type LCD or driver-incorporated type LCD. The gate driver 103 may be provided on both sides of the pixel portion 101. Further, the drain driver 104 may be provided on both sides of the pixel portion 101.

FIG. 2 is an equivalent circuit for a pixel 102 provided between a gate line $G_n$ and a drain line $D_n$. The pixel 102 is formed by a TFT 110 as an active element, a liquid crystal cell LC, and an auxiliary capacitance CS. The TFT 110 has a gate connected to the gate line $G_n$ and a drain connected to the drain line $D_n$. The source of the TFT 103 is connected to the auxiliary capacitance CS and a display electrode (i.e., pixel electrode) LCE1 of the liquid crystal cell LC. The liquid crystal cell LC and auxiliary capacitance CS form the above-described signal holding element. A voltage $V_{com}$ is applied to a common electrode LCE2 of the liquid crystal cell LC. The common electrode LCE2 of each liquid crystal cell LC is an electrode shared by all the pixels 102. An electrostatic potential is established between the display electrode LCE1 and common electrode LCE2. The auxiliary capacitance CS has a first electrode CSE1 connected to the source of the TFT 110 and a second electrode CSE2 to which a constant voltage $V_R$ is applied. The second electrode CSE2 may be connected to the adjacent gate line $G_{n+1}$.

In the pixel portion 101, data signals must be held in the signal holding elements (i.e., LC and CS) during one frame, i.e., during the period from when the pixel driving elements are turned off to when the elements are turned on. Accordingly, each of the polycrystalline silicon TFT's 110 as pixel driving elements experience a small leakage current when turned off. However, it is desirable to have a peripheral driving circuit 105 that operates at high speeds. Consequently, the polycrystalline silicon TFT's forming the peripheral driving circuit 105, when turned on, must be supplied with large currents.

The lower the field effect mobility in an active layer of a polycrystalline silicon TFT is, the smaller the turned-off current of the TFT is. The higher the field effect mobility in the active layer is, the larger the current of the conducting TFT. Therefore, the active layers of the polycrystalline silicon TFT's, functioning as the pixel driving elements at the pixel portion 101, preferably should have low field effect mobility. On the other hand, the active layers of the polycrystalline silicon TFT's, forming the peripheral driving circuit 105, preferably should have high field effect mobility.

In order to satisfy both of these performances conditions for the pixel portion 101 and the peripheral driving circuit 105 simultaneously, it is necessary to optimize the field effect mobility of the polycrystalline silicon films used for the portions 101 and 105. It is therefore desirable to have a method or process of manufacturing a polycrystalline silicon film whose field effect mobility can be adjusted as needed.

In LCD's which are currently available, reliably holding data signals in the signal holding elements for the period of one frame is more important than improving the operating speed of the peripheral driving circuit 105. In conventional integral driver type LCD's, therefore, the field effect mobility of polycrystalline silicon films, used for both of a pixel portion 101 and a driving circuit 105, is set low in an attempt to make the turned-off current of polycrystalline silicon TFT's small. This reduces the turned-on current of polycrystalline silicon TFT's forming a peripheral driving circuit 105, and consequently reduces the operating speed of the driving circuit 105. At this point in time, achieving optimum levels of pixel performance for pixels at portion 101 and at peripheral driving circuit portion 105 has not been successful.

SUMMARY OF THE INVENTION

Accordingly, it is a primary object of the present invention to provide a semiconductor device formed with a polycrystalline silicon film having desired field effect mobility and a process of manufacturing this type of semiconductor device.

It is a secondary object of the present invention to provide a thin film transistor (TFT) in which a polycrystalline silicon film having desired field effect mobility is utilized as an active layer and a process of manufacturing such transistor.

It is a third object of the present invention to provide an integral driver type display device of high performance and a method of manufacturing the display device.

To achieve the foregoing and other objects and in accordance with the purpose of the present invention, improved processes are provided, for manufacturing a semiconductor device including a thin film transistor having a plurality of polycrystalline silicon films.

According to the first manufacturing process according to the present invention, a first polycrystalline silicon film is formed on an insulation substrate. An amorphous silicon film is formed on the first polycrystalline silicon film, and is converted to a second polycrystalline silicon film, by subjecting the amorphous silicon to either solid phase growth or recrystallization. When the first polycrystalline silicon film is produced by Chemical Vapor Deposition (CVD) process or Physical Vapor Deposition (PVD), orientation of the first polycrystalline silicon film is different from that of the second polycrystalline silicon film.

In the second manufacturing process, according to the present invention, a first amorphous silicon film is provided on an insulation substrate, and is converted to a first polycrystalline silicon film by subjecting the first amorphous silicon to either solid phase growth or recrystallization. Next, a second amorphous silicon film is formed on the first polycrystalline silicon film, and is converted to a second polycrystalline silicon film by subjecting the second amorphous silicon to either solid phase growth or recrystallization. Thus, the orientation of the first polycrystalline silicon film is the same as that of the second polycrystalline silicon film.

BRIEF DESCRIPTION OF THE DRAWINGS

The features of the present invention that are believed to be novel are set forth with particularity in the appended claims. The invention, together objects and advantages thereof, may best be understood by reference to the following description of the presently preferred embodiments together with the accompanying drawings in which:

DETAILED DESCRIPTION OF THE PREFERRED EMBODIMENTS

Steps 1 through 4 for manufacturing polycrystalline silicon films used in a semiconductor device according to the present invention will now be described with reference to FIGS. 3A through 3D.

Figure 1:
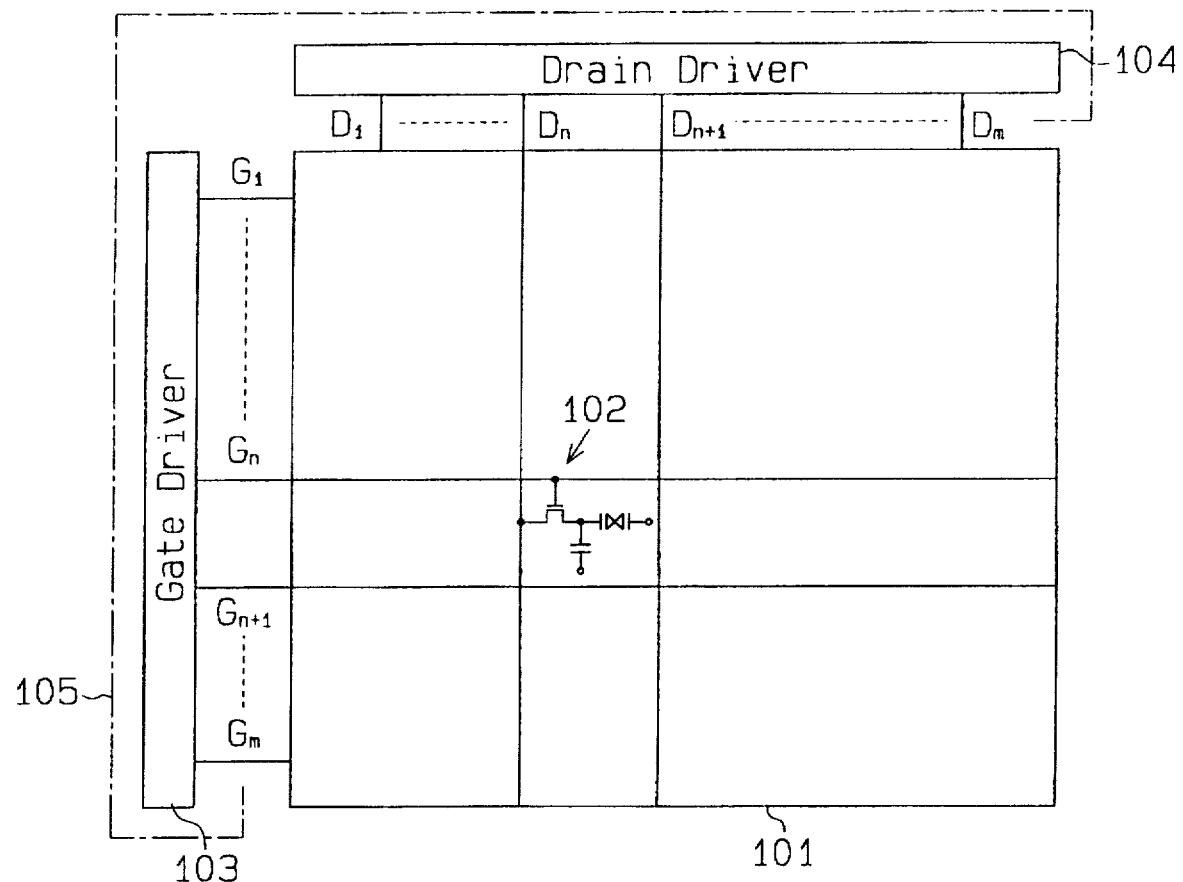
FIG. 1 is a block diagram of a conventional active matrix type liquid crystal display (LCD)
Figure 2:
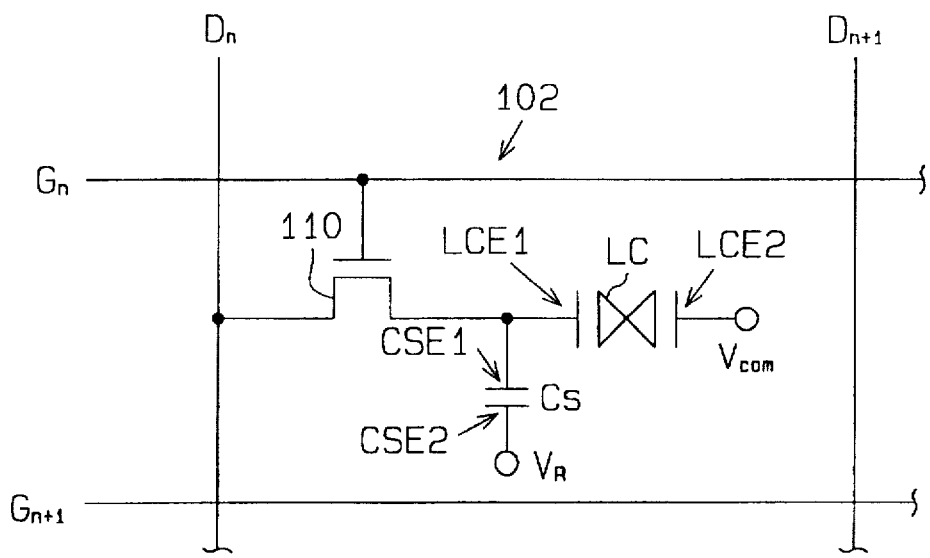
FIG. 2 is an equivalent circuit diagram for the pixel shown in FIG. 1.
Figure 3A:
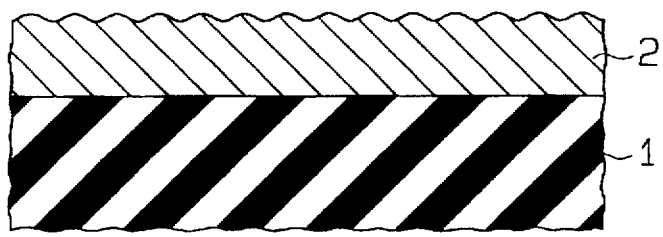
FIGS. 3A through 3D are schematic sectional views illustrating the various stages in processing polycrystalline silicon films, according to the present invention.

STEP 1: As shown in FIG. 3A, a first polycrystalline silicon film 2 is formed on a transparent insulation substrate 1, made of quartz glass or highly heat-resistant glass, according to a thermal chemical vapor deposition (thermal CVD) technique using $SiH_4$ gas. During this CVD process, it is preferable to set the temperature of the substrate in the range of 660° C. to 680° C. and the flow rate of $SiH_4$ gas at 20 sccm.

Figure 3B:
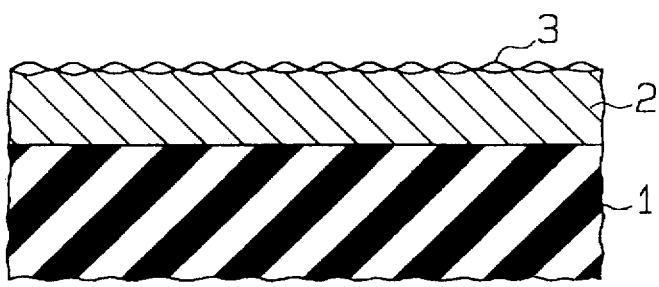

STEP 2: The insulation substrate 1 with the first polycrystalline silicon film 2 formed thereon is taken out from the CVD reaction chamber to be exposed to the atmosphere. Then, as shown in FIG. 3B, oxygen included in the atmosphere causes the surface of the polycrystalline silicon film 2 to oxidize into a silicon oxide layer 3. During the formation of the oxide layer 3, the substrate 1 and the silicon film 2 may be heated to prevent the oxide layer 3 from becoming too thick. Should the oxide layer 3 be too thick, etching of the layer 3 may be performed. The thickness of the oxide layer 3 is preferably about 30 to 50 angstroms.

Figure 3C:
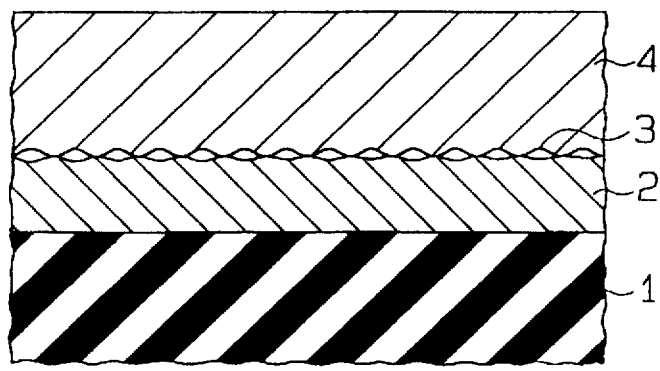

STEP 3: As shown in FIG. 3C, an amorphous silicon film 4 is formed on the first polycrystalline silicon film 2 and the oxide layer 3, by using a plasma CVD process. Preferable conditions for the formation of the amorphous silicon film 4 are as follows.

Figure 3D:
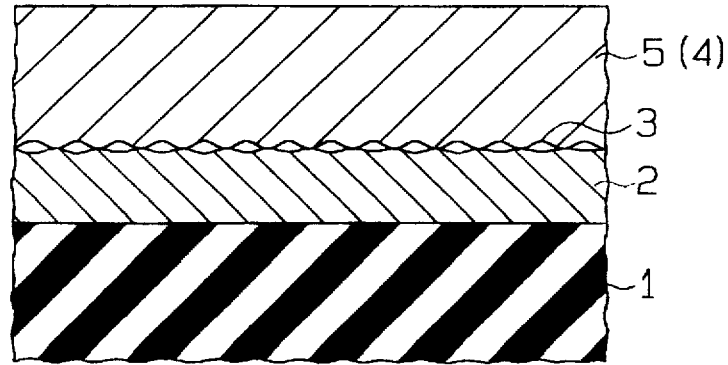

Substrate Temperature: 250° C. to 350° C.
$SiH_4$ Flow Rate: 10 sccm
$H_2$ Flow Rate: 40 sccm
RF Power: 40 Watt STEP 4: As shown in FIG. 3D, the amorphous silicon film 4 is heated and subjected to solid phase growth, so that the amorphous film 4 is converted to a second polycrystalline silicon film 5. Preferable conditions for the heating process are as follows.

Substrate Temperature: 550° C. to 640° C.
Processing Time: 10 hours or longer

Figure 4:
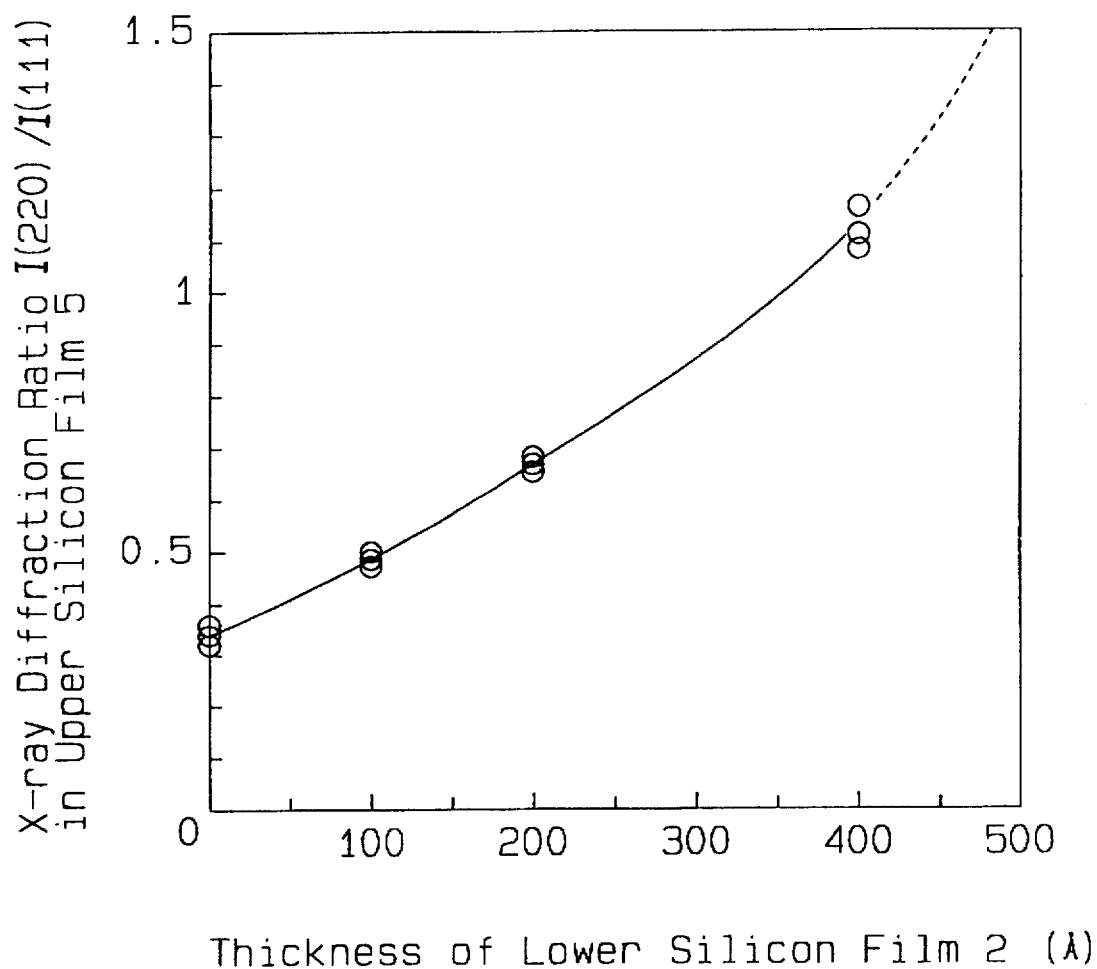
FIG. 4 is a graph illustrating the results of an X-ray diffraction test.

X-ray diffraction analysis is executed for each polycrystalline silicon film sample composed of the first and second polycrystalline silicon films 2 and 5. FIG. 4 shows the result of the X-ray diffraction analysis, i.e., the relationship between the thickness of the first silicon film 2 and the second silicon film 5 when the second film has a variable crystal orientation ratio of I(220)/I(111) wherein "I" represents intensity. While total thickness of each silicon film sample is set to 1,300 angstroms (Å), four film samples were prepared as follows.

| Sample No. | Thickness of first film 2 | Thickness of second film 5 |
|---|---|---|
| 1 | 0 Å | 1,300 Å |
| 2 | 100 Å | 1,200 Å |
| 3 | 200 Å | 1,100 Å |
| 4 | 400 Å | 900 Å |

As the thickness of the first silicon film 2 increases, the (220) crystal orientation in the second polycrystalline silicon film 5 tends to increase, whereas the (111) crystal orientation decreases.

Figure 5:
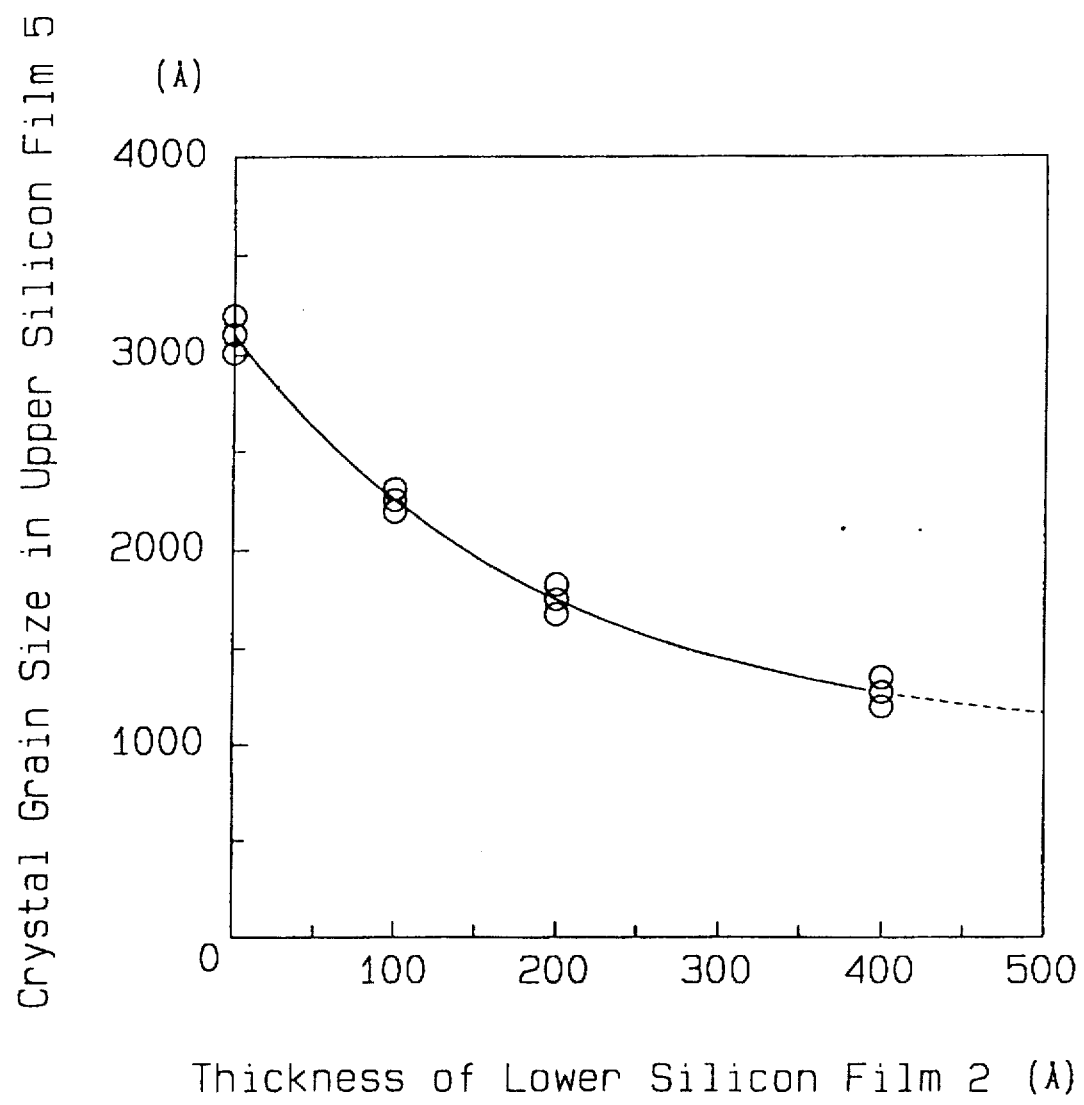
FIG. 5 is a graph illustrating the relationship between the thickness of a first silicon film and the crystal grain size in a second silicon film.

FIG. 5 shows the relationship between the thickness of the lower polycrystalline silicon film 2 and the crystal grain size of the upper polycrystalline silicon film 5. It is apparent that the crystal grain size in the upper polycrystalline silicon film 5 decreases as the thickness of the lower polycrystalline silicon film 2 increases.

Figure 6:
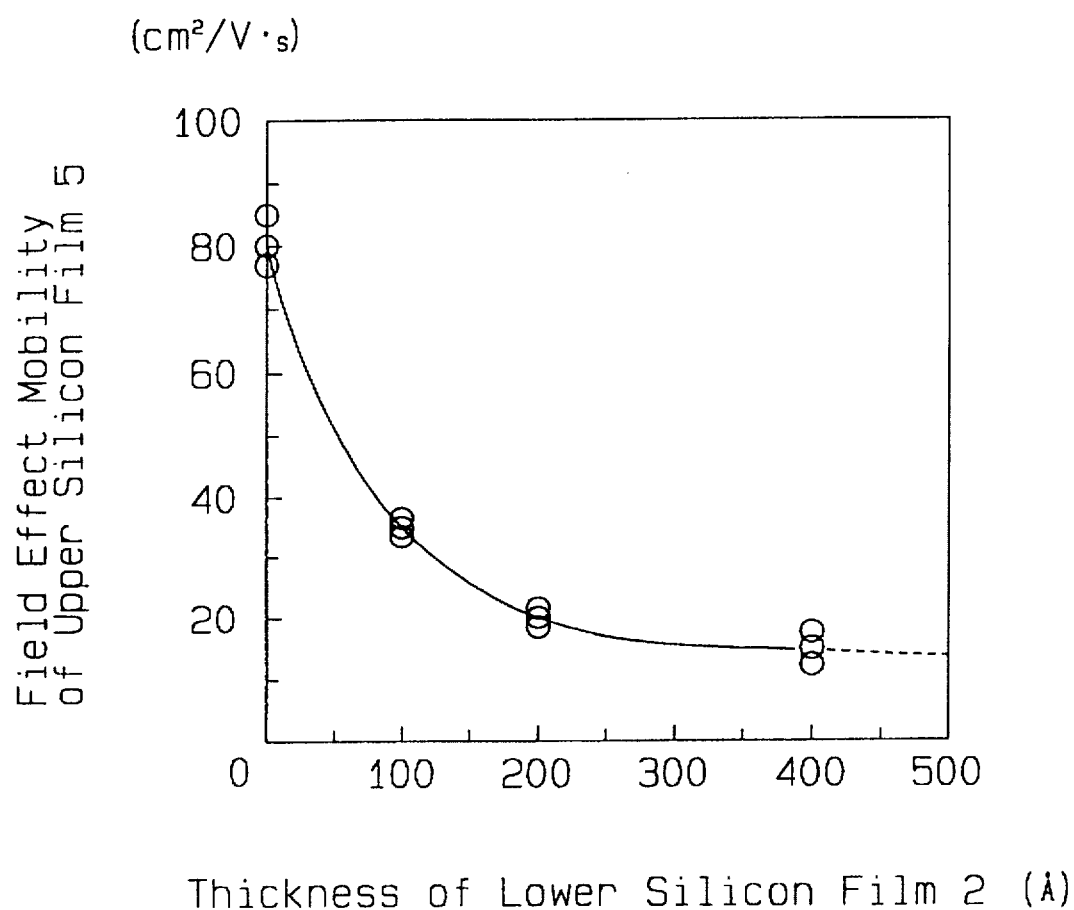
FIG. 6 is a graph illustrating the relationship between the thickness of the first silicon film and the field effect mobility in the second silicon film.

FIG. 6 shows the relationship between the thickness of the lower polycrystalline silicon film 2 and the field effect mobility of the upper polycrystalline silicon film 5. From this graph, it is apparent that the field effect mobility of the upper silicon film 5 is reduced as the thickness of the lower polycrystalline silicon film 2 increases.

As apparent from the above descriptions, according to this embodiment, the properties of the upper polycrystalline silicon film 5 (e.g., crystal orientation, crystal grain size) can be varied by controlling the ratio between the thicknesses of the first and second polycrystalline silicon films 2 and 5. Consequently, the field effect mobility of the second polycrystalline silicon film 5 is also controllable by this technique.

A description will now be made with reference to FIGS. 7A through 7I on a method of manufacturing a planer type polypolycrystalline silicon TFT, the active layers of which is manufactured as described above.

Figure 7A:
FIGS. 7A through 7I are schematic sectional views illustrating the processing of polycrystalline silicon TFT during its manufacture according to the present invention.
Figure 7B:

STEP 1: As shown in FIGS. 7A and 7B, a first polycrystalline silicon film 2 is formed on a transparent insulation substrate 1 by using a thermal CVD process. Then, the insulation substrate 1, having the first polycrystalline silicon film 2 formed thereon, is taken out of the CVD reaction chamber, and is subjected to natural oxidation on the surface of the silicon film 2, whereby an silicon oxide layer 3 is formed on the silicon film 2.

Figure 7C:
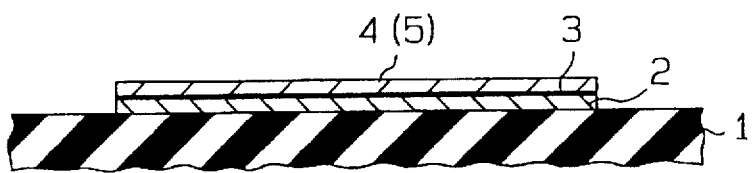
Figure 7D:
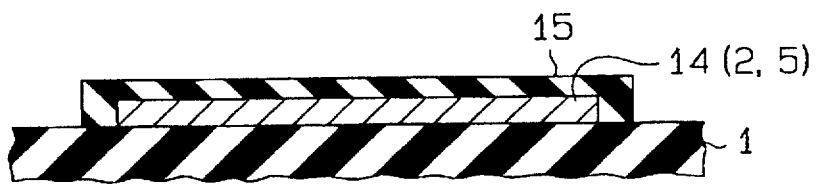

STEP 2: As shown in FIGS. 7C and 7D, an amorphous silicon film 4 is formed on the oxide layer 3 by using a plasma enhanced CVD process. This amorphous silicon film 4 is heated at the substrate temperature of 640° C. in order to undergo solid phase growth. During this heating, the amorphous film 4 is transformed to a second polycrystalline silicon film 5. As a result, the two polycrystalline silicon films 2 and 5 form an integrated polycrystalline silicon film 14. Next, an insulator layer 15 is formed on the polycrystalline silicon film 14, by using, for example, thermal oxidation or CVD techniques.

Figure 7E:
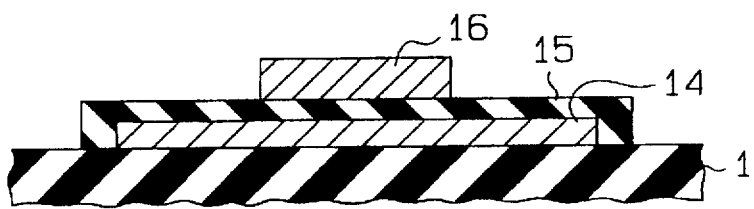

STEP 3: As shown in FIG. 7E, an another polycrystalline silicon film serving as a gate electrode 16 is formed on the insulator layer 15 by using a thermal CVD process.

Figure 7F:
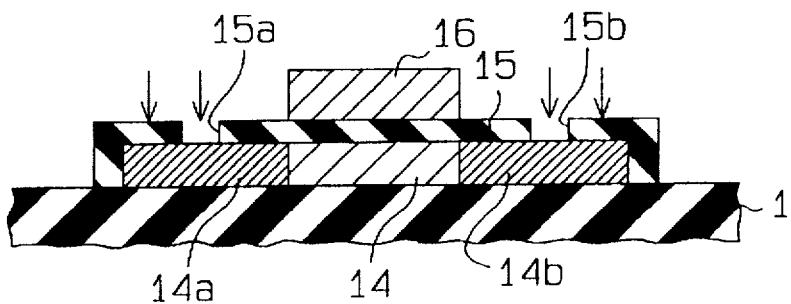

STEP 4: As shown in FIG. 7F, the polycrystalline silicon film 14 is doped with N-type impurities such as phosphorus by using ion implantation technique, thereby forming an N-type drain region 14a and an N-type source region 14b in the polycrystalline silicon layer 14. This can be done using self-aligned gate processing. At the same time, the polycrystalline silicon film 16 serving as the gate electrode is doped with the N-type impurities to reduce the resistance of the electrode. Thereafter, holes 15a and 15b are formed in the insulator layer 15 by anisotropic etching.

Figure 7G:
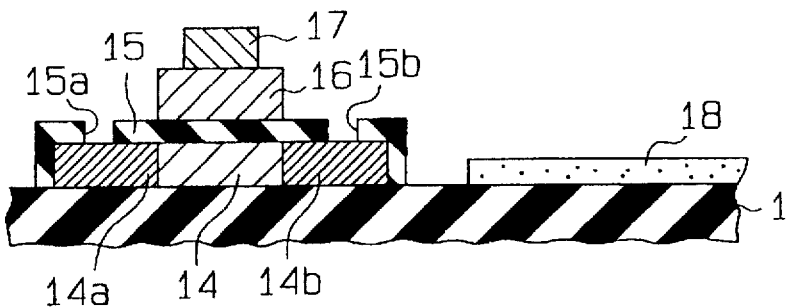

STEP 5: As shown in FIG. 7G, an auxiliary capacity electrode 18, made of for example an indium tin oxide (ITO), is formed on the LCD pixel portion of the transparent insulation substrate 1 by sputtering. During the sputtering process, a metal gate electrode 17, made of e.g. molybdenum (Mo), is formed on the gate electrode 16.

Figure 7H:
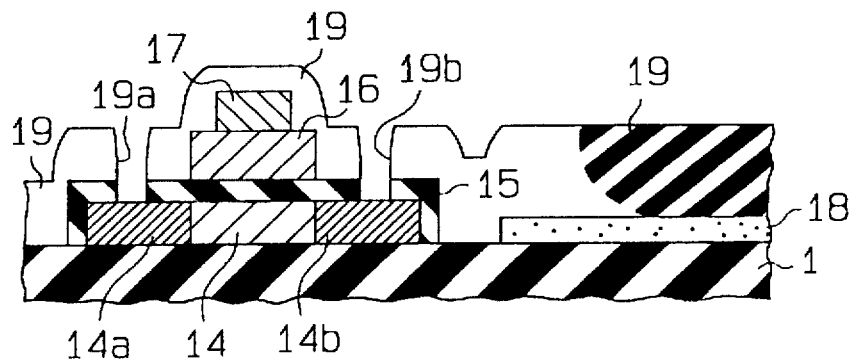

STEP 6: As shown in FIG. 7H, an interlayers insulation film 19, made of e.g. silicon nitride ($SiN_x$), is formed on the entire surface of the partially fabricated transistor by using a CVD process. Then, portions of the insulation film 19 are etched at the areas above the drain and source regions 14a and 14b to form contact holes 19a and 19b.

Figure 7I:
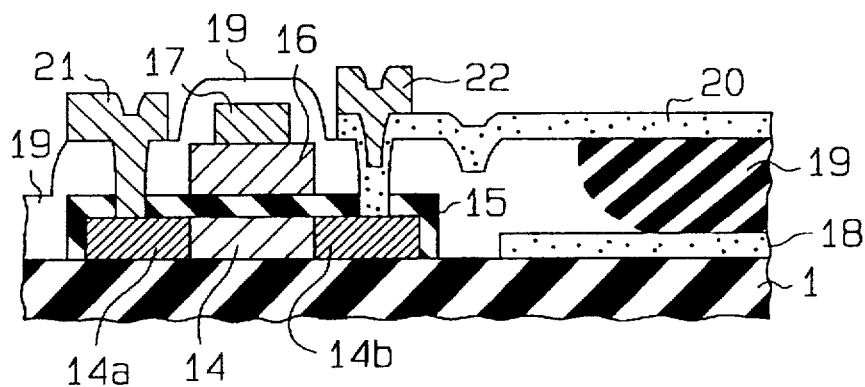

STEP 7: As shown in FIG. 7I, a pixel electrode 20, which can be made of ITO, for example, is formed on the insulation film 19 at the pixel portion by using a sputtering process. The pixel electrode 20 is electrically connected to the source region 14b via the contact hole 19b. Then, a drain electrode 21 and a source electrode 22 are formed such that the drain electrode 21 and source electrode 22 are electrically connected to the drain region 14a and source region 14b, respectively. This completes a polycrystalline silicon TFT as a pixel driving element for an LCD.

Figure 8:
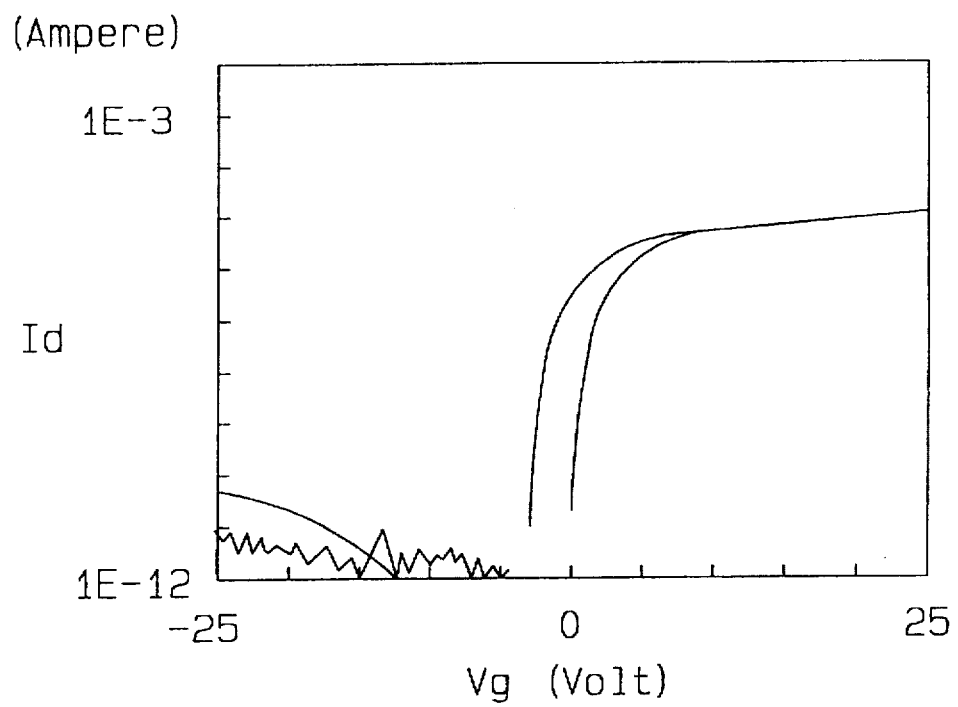
FIG. 8 is a graph illustrating the relationship between the gate potential and the drain current in an embodiment of a TFT according to the present invention.

FIG. 8 shows the characteristic relation between the gate voltage (Vg) and drain current (Id) in the above described polycrystalline silicon TFT. This characteristic is obtained under the condition where the thicknesses of the first and second polycrystalline silicon films 2 and 5 are set to 400 and 600 angstroms, respectively. The field effect mobility of the integrated polycrystalline silicon film 14 (having a thickness of 1,000 angstroms) as a whole is calculated at 20 $cm^2/V \cdot s$.

Figure 9:
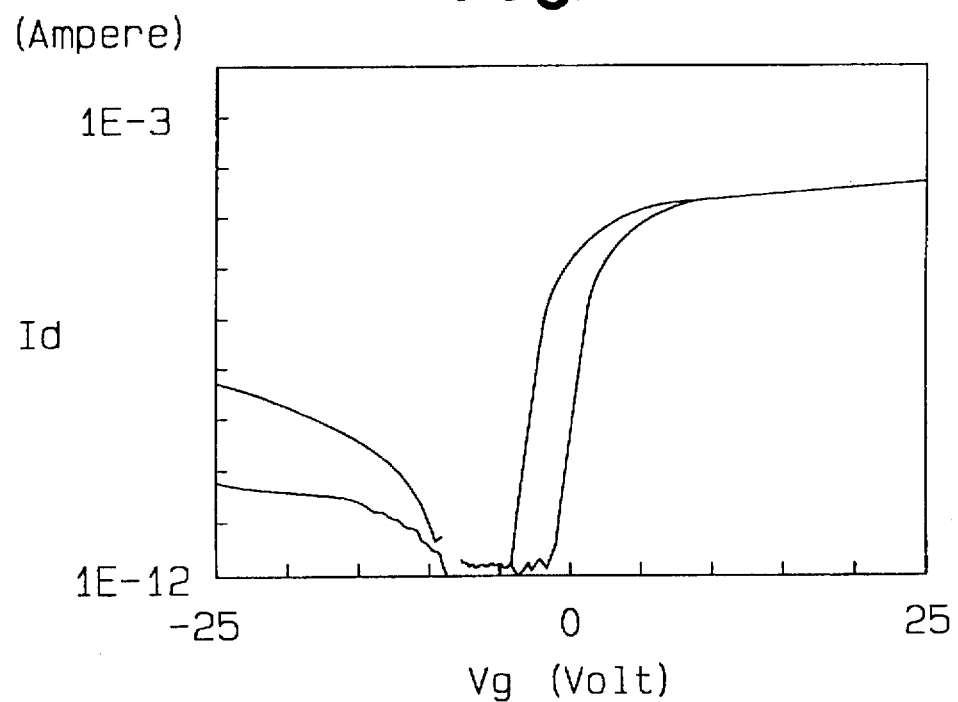
FIG. 9 is a graph illustrating the relationship between the gate potential and the drain current in a conventional TFT.

FIG. 9 shows the characteristic relation between the gate voltage (Vg) and drain current (Id) in a comparative polycrystalline silicon TFT. The comparative TFT was obtained by forming an amorphous silicon layer (having a thickness of 1,000 angstroms) on an insulation substrate, followed by the solid-phase-growing of the amorphous silicon layer to form a polycrystalline silicon film as an active layer having a thickness of 1,000 angstroms. In other words, the active layer of the comparative TFT is formed by a single polycrystalline silicon film, unlike the polycrystalline silicon film 14 according to the present embodiment, which is formed by the two polycrystalline silicon films 2 and 5 serving as active layers. The field effect mobility of the polycrystalline silicon film in the comparative TFT is calculated at 80 cm$^2$/V•s.

As apparent from the graphs in FIGS. 8 and 9, the polycrystalline silicon TFT according to this embodiment exhibits very small drain current in the area where the gate voltage is negative. This characteristic is very advantageous for a pixel driving element.

As described above, in this embodiment, the second polycrystalline silicon film 5 is prepared by a series of sequences in which: the surface of the first polycrystalline silicon film 2, formed on the insulation substrate 1, is oxidized to form oxide layer 3; the amorphous silicon film 4 is formed on the first silicon film 2 and oxide layer 3; and the amorphous silicon film 4 is subjected to solid phase growth to convert it to the second polycrystalline silicon film 5.

In general, when the first polycrystalline silicon film 2 is formed by using a CVD process, such as thermal CVD, the first polycrystalline silicon has primary crystal orientation having a Miller indices of (220) and a field effect mobility of about 18 cm$^2$/V•s. On the other hand, the second polycrystalline silicon film 5, obtained as a result of solid phase growth of the amorphous silicon film 4, has primary crystal orientation expressed as a Miller indices of (111) and a field effect mobility of about 80 cm$^2$/V•s. That is, the field effect mobility of polycrystalline silicon films can be controlled by the choice of film formation processes. It is possible to obtain a polycrystalline silicon film 14 having desired field effect mobility by combining two polycrystalline silicon films 2 and 5 having different levels of field effect mobility.

The amorphous silicon film 4 is formed after the formation of the oxide layer 3 on the first polycrystalline silicon film 2 in this embodiment. Oxidation of the surface of the polycrystalline silicon film 2 can be easily achieved by, for example, exposing the film surface to the atmosphere (i.e., natural oxidation). The oxide layer 3 partially covers the surface of the first polycrystalline silicon film 2, due to the unevenness of the film Surface and due to variations in crystal plane orientation on the film surface. When the amorphous silicon film 4, formed on the first silicon film 2 and partially covered by the oxide layer 3, is crystallized by heating, crystallization occurs at portions where the first silicon film 2 contacts the amorphous silicon film 4.

According to this embodiment, the integrated polycrystalline silicon film 14 is produced from the combination of the lower and upper polycrystalline silicon films 2 and 5 which have the different levels Of field effect mobility. It is therefore possible to set the field effect mobility of the integrated polycrystalline silicon film 14 to a desired value by controlling the ratio between the thicknesses of the first and second polycrystalline silicon films 2 and 5. For example, if the polycrystalline silicon film 14 is to have an overall thickness of 1,000 angstroms, it is preferable that the thickness of the first polycrystalline film 2 be in the range of 50 to 400 angstroms and the thickness of the second polycrystalline film 5 be in the range of 950 to 600 angstroms. In this embodiment, the oxide layer 3 may be omitted.

Another process for forming the first polycrystalline film 2 as shown in FIG. 3A and 7B will now be described below. If a first polycrystalline silicon film 2 is formed using a CVD process as in the above-described embodiment, the primary crystal orientation of the polycrystalline silicon will have a Miller indices of (220). On the other hand, the second polycrystalline silicon film 5, obtained as a result of solid phase growth of the amorphous silicon film 4, has primary crystal orientation, i.e., a Miller indices of (111). That is, in the above-described embodiment, the second polycrystalline silicon film 5 having primary crystal orientation of (111) is formed on the first polycrystalline silicon film 2 having primary crystal orientation of (220). Such a multi-layer structure consisting of the polycrystalline silicon films 2 and 5 having different orientations may cause the characteristics of TFT to vary, resulting in, for example, the variations in withstand voltage and the uneven distributions of impurities in the drain and source regions 14a and 14b.

In order to prevent such disadvantages, it has been proposed that the first or lower polycrystalline silicon film 2 should also be provided by means of solid phase growth. Specifically, an amorphous silicon film is formed on a transparent insulation substrate 1 by using a plasma CVD process, during which the film heated at a temperature in the range of 600° to 640° for 10 hours or longer. As a result of being subjected to solid phase growth, the amorphous silicon film is transformed into a first polycrystalline silicon film 2. Thereafter, a second polycrystalline silicon film 5 is formed on the first polycrystalline silicon film 2, by solid phase growth as in the above-described embodiment. According to this process, both of the first and second polycrystalline silicon films 2 and 5 can have a primary orientation of (111).

Figure 10:
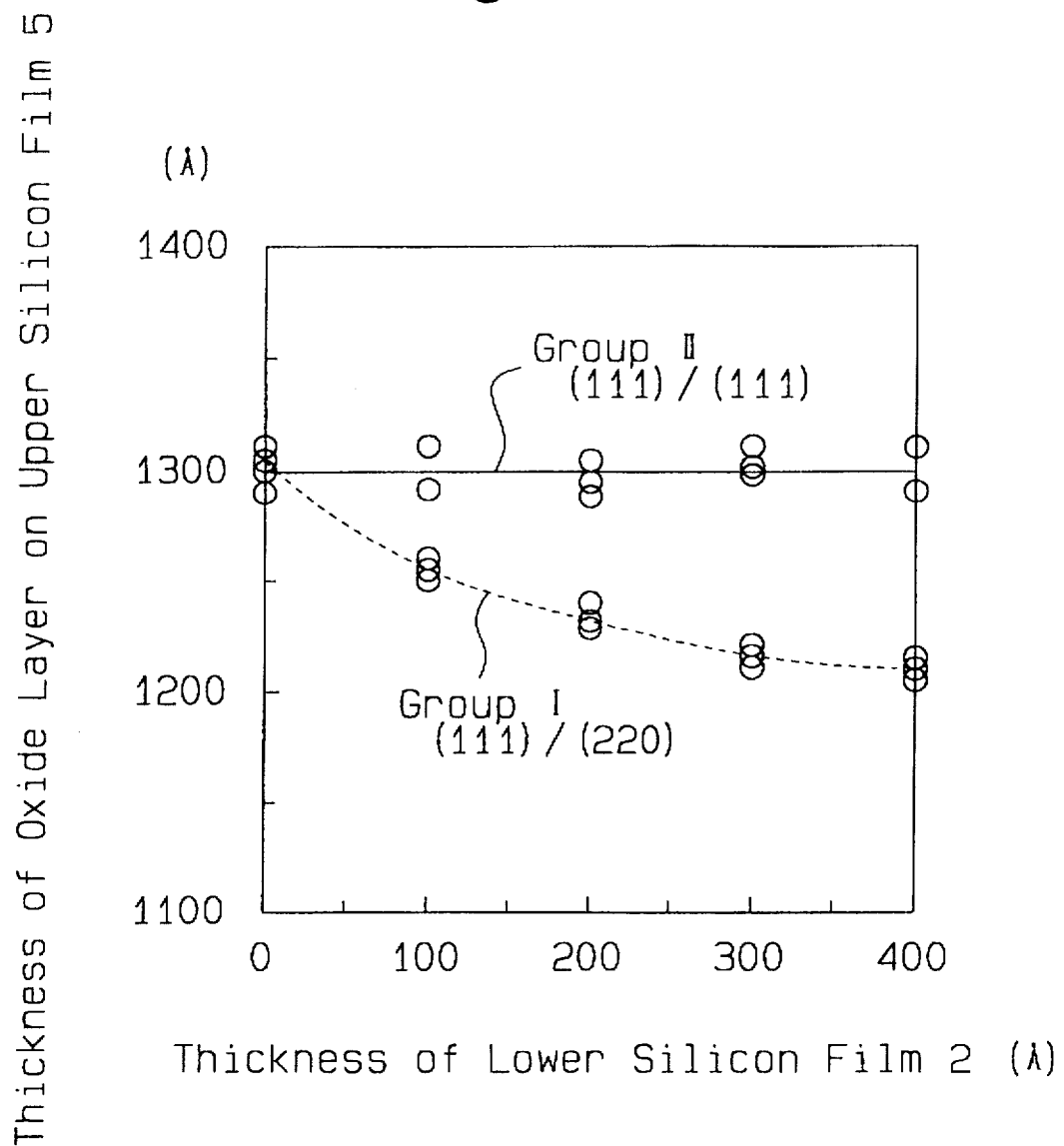
FIG. 10 is a graph of the result of the test in which a two-layer type polycrystalline silicon film is subjected to thermal oxidation.

A test was undertaken in which two groups of two-layer type polycrystalline silicon film had their surface layer subjected to thermal oxidation. The results of this test, illustrating the relationship between the thickness of the first polycrystalline silicon film 2 and the thickness of the oxide layer formed on the second polycrystalline silicon film 5, are shown in FIG. 10.

Each of test pieces belonging to the first group includes the first polycrystalline silicon film 2 having primary orientation of (220) and the second polycrystalline silicon film 5 having primary orientation of (111). The feature of the first group is that as the thickness of the oxide layer on the second film 5, decreases the thickness of the first silicon film 2 increases. The variations in the thickness of the oxide layer suggests that the characteristics of TFT's vary depending on manufacturing process.

Each of the test pieces belonging to the second group were formed with the first polycrystalline silicon film 2 having a primary orientation of (111) and the second polycrystalline silicon film 5 having a primary orientation of (111). In this second group, the thickness of the oxide layer remained constant regardless of the variations in the thickness of the first polycrystalline silicon film 2. This fact suggests that TFT Characteristics are, according to the present invention, not effected by TFT manufacturing processes.

Thus, the variations in TFTs' characteristics due to their manufacture can be avoided by forming both of the polycrystalline silicon films 2 and 5 using solid phase growth process so that they both have primary orientation of (111).

Figure 11:
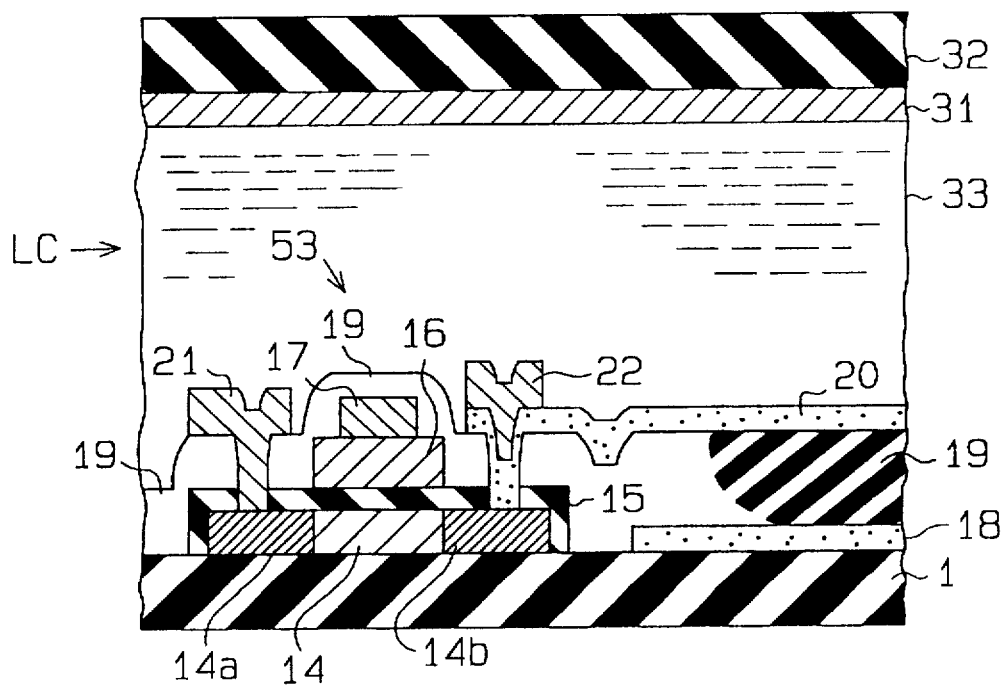
FIG. 11 is a schematic sectional view illustrating the process by which steps a LCD pixel portion, according to the present invention, is manufactured.

A description will now be given, with reference to FIG. 11, on a method of manufacturing a pixel portion of an LCD having a transmission type configuration wherein polycrystalline silicon TFT's as described above are used as pixel driving elements.

A transparent insulation substrate 1 having polycrystalline silicon TFT's formed thereon and a transparent insulation substrate 32 having a common electrode 31 formed thereon are placed in a face-to-face relationship with each other. A liquid crystal layer 33 is formed by sealing the gap between the substrates 1 and 32 with liquid crystal. Thus, the pixel portion of the LCD is completed.

The description of the method for manufacturing polycrystalline silicon TFT's forming the peripheral driving circuit of this LCD will not be described since that method is identical to the manufacture of the above-described polycrystalline silicon TFT's as pixel driving elements, except that the pixel electrode 20 is deleted. The polycrystalline silicon TFT's forming the peripheral driving circuit include N-channel type TFT's and P-channel type TFT's. The N-channel TFT has an N-type drain region 14a and an N-type source region 14b, like a polycrystalline silicon TFT. The P-channel TFT has a drain region 14a and a source region 14b formed by doping p-type impurities therein.

Figure 12:
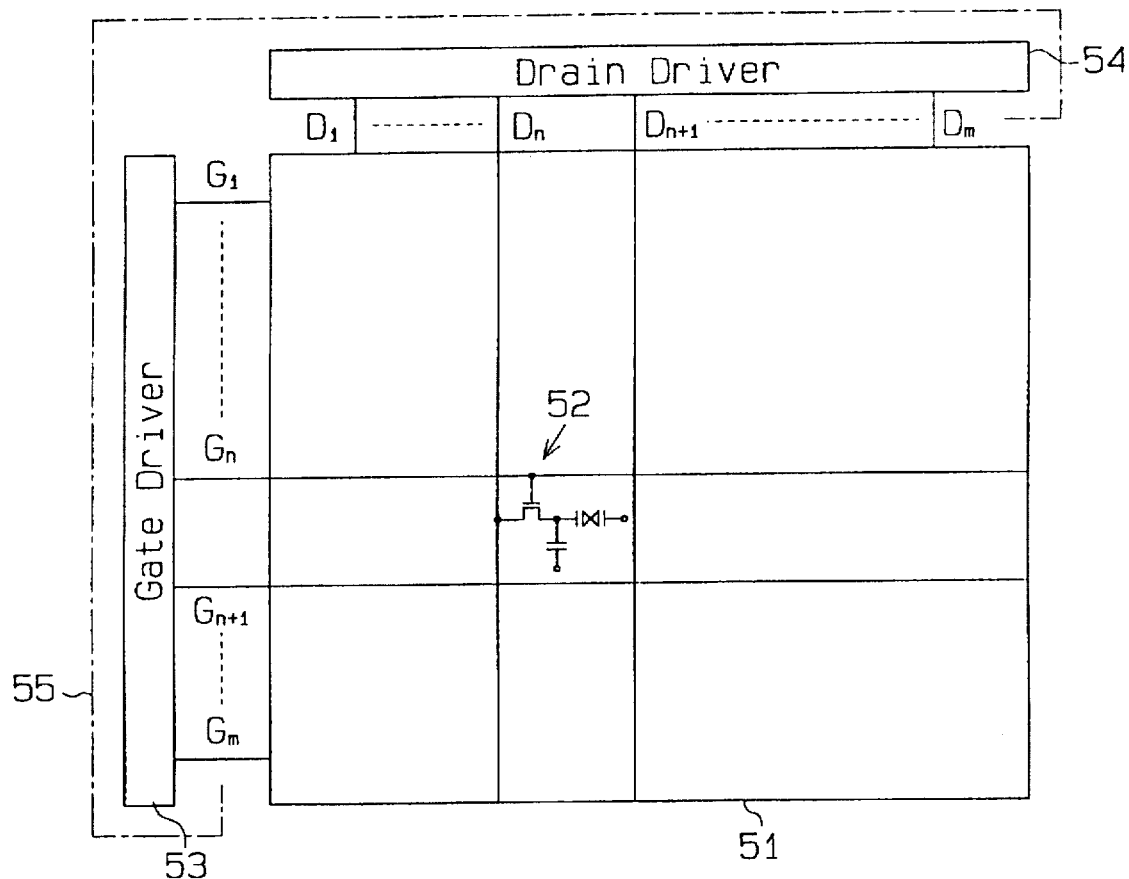
FIG. 12 is a block diagram of an active matrix type LCD.

FIG. 12 is a block diagram of an active matrix type LCD according to the present invention. A pixel portion 51 includes a plurality of scanning lines (i.e., gate lines) $G_1, \ldots G_n, G_{n+1}, \ldots, G_m$, and a plurality of data lines (i.e., drain lines) $D_1, \ldots, D_n, D_{n+1}, \ldots, D_m$. The gate and drain lines extend perpendicularly to each other, and pixels 52 are provided between them. The gate lines are connected to a gate driver 53 for applying gate signals (i.e., scanning signals) to the gate lines. The drain lines are connected to a drain driver 54 that supplies data signals (i.e., video signals) to the drain lines. These drivers 53 and 54 form a peripheral driving circuit 55. An LCD having at least one of the drivers 53 or 54 formed on the same substrate as that on which the pixel portion 51 resides is called an integral driver type LCD or driver-incorporated type LCD. The gate drivers 53 and drain drivers 54 may be provided at both sides of the pixel portion 51, respectively.

Figure 13:
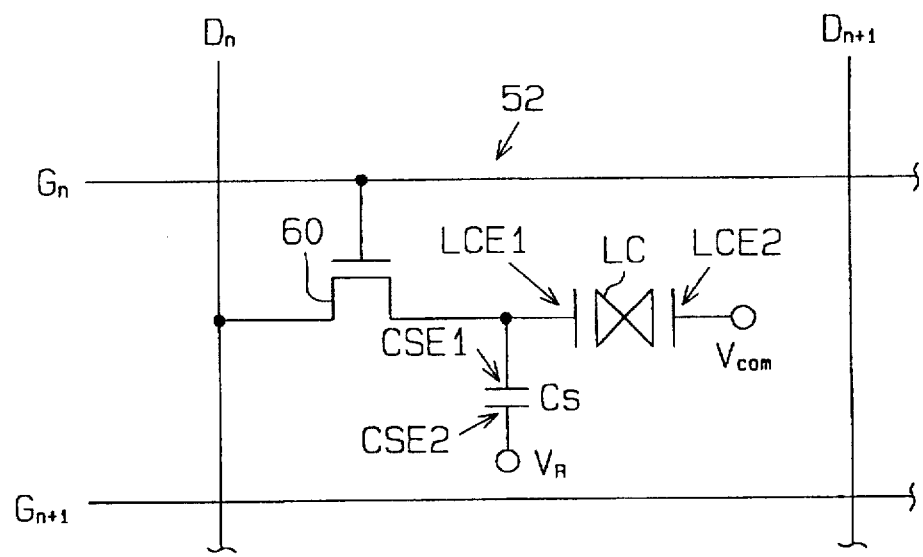
FIG. 13 is an equivalent circuit diagram for a pixel shown in FIG. 12.

FIG. 13 is an equivalent circuit for a pixel portion 52 provided between a gate line $G_n$ and a drain line $D_n$. The pixel 52 is formed by a TFT 60 as a pixel driving element, a liquid crystal cell LC, and an auxiliary capacitance CS. The TFT 60 has a gate connected to the gate line G, and a drain connected to the drain line $D_n$. The source of the TFT 60 is connected to a display electrode (i.e., pixel electrode) LCE1 of the liquid crystal cell LC and the auxiliary capacitance CS. The liquid crystal cell LC and auxiliary capacitance CS form a signal holding element. A voltage $V_{com}$ is applied to a common electrode LCE2 of the liquid crystal cell LC. The common electrode LCE2 is an electrode shared by all the pixels 52. A static Capacity is established between the display and common electrodes LCE1 and LCE2. The auxiliary capacitance CS has a first electrode CSE1 connected to the source of the TFT 60 and a second electrode CSE2 to which a constant voltage VR is applied. The second electrode CSE2 of the auxiliary capacitance CS may be connected to the adjacent gate line $G_{n+1}$.

When a positive voltage is applied to the gate of the TFT 60 in the pixel 52 by developing a positive voltage on the gate line $G_n$, the TFT 60 turns on. Then, a data signal applied to the drain line $D_n$ will charge the liquid crystal cell LC and the auxiliary capacitance CS. Conversely, when a negative voltage is applied to the gate of the TFT 60 by developing a negative voltage on the gate line $G_n$, the TFT 60 turns off. The voltage applied to the drain line $D_n$ at that time will then be held by the cell LC and capacitance CS. In this way, it is possible to cause a pixel 52 to keep any data signal by sending the data signal, held by the pixel 52, via the drain line and by controlling the voltage on the gate line. The transmissivity of the liquid crystal cell LC changes in accordance with the data signal kept by the pixel 52, resulting in the display of an image.

Figure 14:
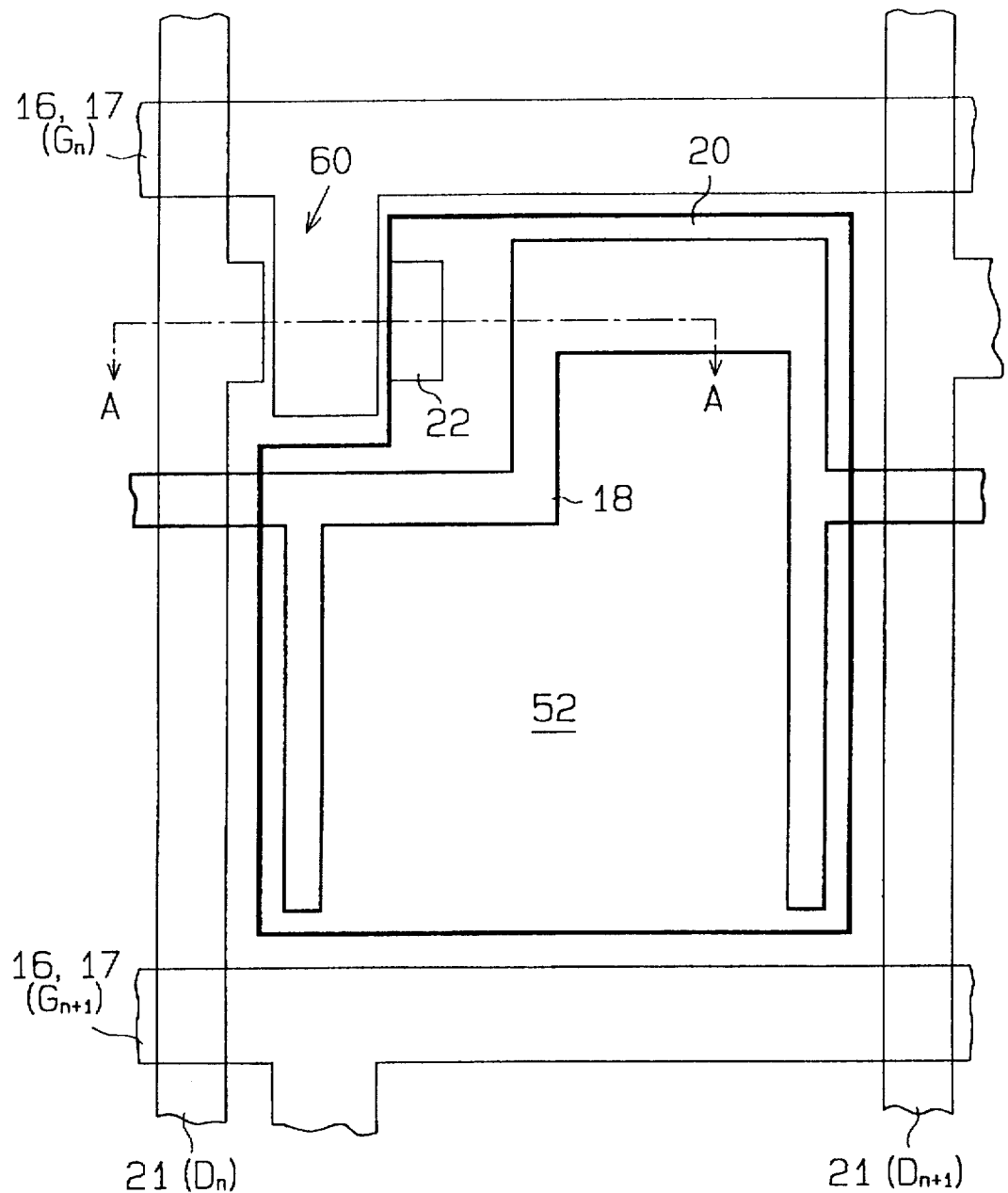
FIG. 14 is a plan view of a pixel.

FIG. 14 is a plan view of a pixel 52. FIGS. 7A through 7I and FIG. 11 are sectional views taken along the line A—A in FIG. 14. As described above, data signals must be held in the signal holding elements (i.e., the liquid crystal cell LC and auxiliary capacitance CS) during one frame, i.e., the period after the pixel driving elements are turned off until the elements are turned on again. Therefore, the polycrystalline silicon TFT's 60 as pixel driving elements provided at the pixel portion 51 must have small leak currents (i.e., small turned-off currents). On the other hand, the peripheral driving circuit 55 must have a high operation speed, and accordingly the polycrystalline silicon TFT's forming the peripheral driving circuit 55 must have large turned-on currents.

The smaller the field effect mobility of the active layer of the polycrystalline silicon TFT is, the smaller the turned-off current of the TFT is. The larger the field effect mobility of the active layer is, the larger the turned-on current of the TFT is. Therefore, the polycrystalline silicon films used as the active layers of the TFT's as the pixel driving elements provided at the pixel portion 51 should have a small field effect mobility. Conversely, the polycrystalline silicon films used as the active layers of the TFT's forming the peripheral driving circuit 55 preferably have large field effect mobility.

Thus, in order to satisfy both of the performances required for the pixel portion 51 and the peripheral driving circuit 55 simultaneously, it is necessary to optimize the field effect mobility of the polycrystalline silicon films used for the pixel portion 51 and circuit 55.

According to the present invention, it is possible to control the field effect mobility of the second polycrystalline silicon film 5 by varying the thicknesses of the first and second polycrystalline silicon films 2 and 5. This allows the field effect mobility of the polycrystalline silicon films used for the portion 51 and circuit 55 to be set at optimum values so as to reduce the turned-off currents of the TFT's. This thickness variation moreover, allows for increased turn-on currents for the TFT's forming the peripheral driving circuit 55.

Furthermore, by setting, the thickness of the first polycrystalline silicon film smaller than the thickness of the first film 2 corresponding to the pixel portion 51, the field effect mobility of the second polycrystalline silicon film 5 at the peripheral driving circuit 55 will be relatively large and the field effect mobility of the second film 5 at the pixel portion 51 will be relatively small. As a result, the performance of the pixel portion 51 and the peripheral driving circuit 55 results in improved integral driver type LCD.

An arrangement may be made so that the first polycrystalline silicon film 2 is formed only on the part of the transparent insulation substrate 1 corresponding to the pixel portion 51 rather than on the part corresponding to the peripheral driving circuit 55. This also makes it possible to set the field effect mobility of the second film 5 at the peripheral driving circuit 55 relatively large to that of the field effect mobility of the second film 5 at the pixel portion 51.

Although only one embodiment of the present invention has been described herein, it should be apparent to those skilled in the art that the present invention may be embodied in many other specific forms without departing from the spirit or scope of the invention. Particularly, it should be understood that the present invention may be implemented in the following alternative manners.

The first polycrystalline silicon film 2 and amorphous silicon film 4 may be formed using physical vapor deposition (PVD) process or CVD processes other than thermal CVD and plasma enhanced CVD. CVD processes include normal pressure CVD, low pressure CVD, plasma enhanced CVD, and optically excited CVD. PVD processes include physical deposition, electron beam (EB) deposition, molecular beam epitaxy (MBE) process and sputtering.

The first and second polycrystalline silicon films 2 and 5 may be formed using "melting and recrystallizing process" instead of solid phase growth. Melting and recrystallizing processes are methods wherein an amorphous silicon film is melted only on the surface, recrystallized with the substrate temperature maintained equal to or below 600° C., and annealed by using both laser and rapid thermal annealing (RTA) methods. Laser annealing is a method wherein the surface of an amorphous silicon film is heated and melted by irradiation with a laser. RTA method is a method wherein the surface of an amorphous silicon film is heated and melted by irradiation with a lamp.

During the manufacture of a TFT after the polycrystalline silicon film 14 is formed, a hydrogenation process may be performed to improve the characteristics of the TFT. Hydrogenation process is a method wherein hydrogen atoms are combined with portions of polycrystalline silicon having crystalline defects to complete the crystal structure, thereby improving field effect mobility.

Impurities may be doped to the channel region between the drain region 14a and the source region 14b of the polycrystalline silicon film 14 so as to control the threshold voltage ($V_{th}$) of the TFT. In a TFT where the active layer of a polycrystalline silicon film was formed by solid phase growth, the threshold voltage of an N-channel transistor tends to approach that of depression type transistor, while the threshold voltage of an P-channel transistor tends to approach that of enhancement type transistor. This tendency is significant especially when a hydrogenation process is performed. The channel region may be doped with impurities to suppress the shift of the threshold voltage.

The present invention may be applied not only to planer type TFT's but also to TFT's of any structure such as the reverse planer type, stagger type, and reverse stagger type.

The present invention may be applied not only to TFT's but also to general insulated gate type semiconductor devices. In addition, the present invention may be applied to any semiconductor circuits that use silicon films such as a photoelectric transfer element, bipolar transistor, and static induction transistor (SIT).

The present invention may be applied to a contact type image sensor, a three-dimensional IC, etc. with the transparent insulation substrate 1 replaced with an insulation layer such as a ceramic substrate and a silicon oxide film.

The TFT according to the present invention may be used as a charge transfer element in a memory cell of a dynamic RAM (DRAM) or as a load element in a memory cell of a static RAM (SRAM). Further, the present invention may be applied to an LCD having a reflection type configuration instead of the transmission type configuration.

The term "insulation substrate" as used in this specification implies not only substrates made of any insulating material such as quartz glass, highly heat resistant glass and resin, and ceramics but also metal or conductive substrates having an insulation layer which is formed thereon and is made of silicon oxide.

Therefore, the present examples and embodiments are to be considered as illustrative and not restrictive and the invention is not to be limited to the details given herein, but may be modified within the scope of the appended claims.

What is claimed is:

1. A method of manufacturing a semiconductor device having a single polycrystalline layer comprising plurality of polycrystalline silicon films, said polycrystalline layer having a selected field effect mobility, said method comprising the steps of:

forming a first of said plurality of polycrystalline silicon films on an insulation substrate;

forming an amorphous silicon film on said first polycrystalline silicon film;

forming a second of said plurality of polycrystalline silicon films from said amorphous silicon film, by subjecting said amorphous silicon film to one of a solid phase growth and a recrystallization process; and controlling said steps of forming said first and second polycrystalline silicon films to obtain said selected field effect mobility of said single polycrystalline layer by varying a ratio of thickness of said first polycrystalline silicon film to thickness of said second polycrystalline silicon film.

2. The method according to claim 1, wherein said first polycrystalline silicon film is produced by one of a Chemical Vapor Deposition (CVD) process and a Physical Vapor Deposition (PVD) process, whereby the crystal orientation of first polycrystalline silicon film is different from that of said second polycrystalline silicon film.

3. The method according to claim 2, wherein said first polycrystalline silicon film is produced by a thermal CVD process in which the temperature of said insulation substrate is set in the range of 660° C. to 680° C. in order to differentiate crystal orientation of said first polycrystalline silicon film from crystal orientation of said second polycrystalline silicon film.

4. The method according to claim 1 further comprising the step of forming silicon oxide on a portion of the surface of said first polycrystalline silicon film before the formation of said amorphous silicon film.

5. A method of manufacturing a thin film transistor, said transistor comprising a single polycrystalline layer, said layer having a selected field effect mobility, said method comprising the steps of:

forming a first polycrystalline silicon film on an insulation substrate;

forming an amorphous silicon film on said first polycrystalline silicon film;

forming a second polycrystalline silicon film from said amorphous silicon film, by subjecting said amorphous silicon film to one of a solid phase growth and a recrystallization process, whereby said single polycrystalline layer comprises both said first polycrystalline silicon film and said second polycrystalline silicon film;

controlling said steps of forming said first and second polycrystalline silicon films to obtain said selected field effect mobility of said single polycrystalline layer by varying a ratio of thickness of said first polycrystalline silicon film to thickness of said second polycrystalline silicon film;

forming a gate insulation layer on said second polycrystalline silicon film;

forming a gate electrode on said gate insulation layer; and forming source and drain regions at positions adjacent to said gate electrode in said first and second polycrystalline silicon films.

6. The method according to claim 5, wherein said first polycrystalline silicon film is produced by one of a CVD process and a FVD process, whereby the Crystal orientation of said first polycrystalline silicon film is different from that of said second polycrystalline silicon film.

7. The method according to claim 5, wherein the step of forming said first polycrystalline silicon film includes the steps of:

forming an amorphous silicon film on said insulation substrate; and forming said first polycrystalline silicon film from said amorphous silicon film, by subjecting the amorphous silicon to one of a solid phase growth and a recrystallization process, whereby the crystal orientation of the first polycrystalline silicon film is the same as that of said second polycrystalline silicon film.

8. The method according to claim 5 further comprising the steps of:

forming an interlayer insulation film on an entire surface of the transistor device after the formation of said gate electrode on said gate insulation layer;

forming a contact hole on said interlayer insulation film to expose said source and drain regions; and providing a source electrode connecting said source region and a drain electrode connecting said drain region.

9. A method of manufacturing an integral driver type display device in which a pixel portion and a pixel driving circuit are provided on an insulation substrate, said method comprising the steps of:

forming a first polycrystalline silicon film on the insulation substrate in such a manner that the thickness of the silicon film in the area associated with the pixel portion is thicker than the thickness of the silicon film in the area associated with the pixel driving circuit;

forming an amorphous silicon film on said first polycrystalline silicon film; and forming a second polycrystalline silicon film from said amorphous silicon film, by subjecting the amorphous silicon to one of a solid phase growth and a recrystallization process.

10. The method according to claim 9, wherein said first polycrystalline silicon film is produced by one of a CVD process and a PVD process, whereby the crystal orientation of the first polycrystalline silicon film is different from that of said second polycrystalline silicon film.

11. The method according to claim 9, wherein the step of forming said first polycrystalline silicon film includes the steps of:

forming an amorphous silicon film on said insulation substrate in such a manner that the thickness of the amorphous silicon film in the area associated with the pixel portion is thicker than the thickness of the amorphous silicon film in the area associated with the pixel driving circuit; and forming said first polycrystalline silicon film from said amorphous silicon film, by subjecting the amorphous silicon to one of a solid phase growth and a recrystallization process, whereby the crystal orientation of the first polycrystalline silicon film is the same as that of said second polycrystalline silicon film.

12. The method according to claim 9 further comprising the step of forming a thin film transistor in which at least one of said first and second polycrystalline silicon film is used as an active layer.

13. The method according to claim 9 further comprising the step of forming silicon oxide on a portion of the surface of said first polycrystalline silicon film before the formation of said second amorphous silicon film.

* * * * *